United States Patent
De Ruijter (10) Patent No.: US 7,405,613 B2
(45) Date of Patent: Jul. 29, 2008

(54) DIFFERENTIAL SLOPE DEMODULATOR FOR LOW-IF FREQUENCIES

(75) Inventor: Hendricus C. De Ruijter, Sunnyvale, CA (US)

(73) Assignee: Integration Associates Inc., Mountain View, CA (US)

( * ) Notice: Subject to any disclaimer, the term of this patent is extended or adjusted under 35 U.S.C. 154(b) by 189 days.

(21) Appl. No.: 11/399,058

(22) Filed: Apr. 6, 2006

(65) Prior Publication Data

US 2006/0226897 A1   Oct. 12, 2006

Related U.S. Application Data

(60) Provisional application No. 60/668,922, filed on Apr. 6, 2005, provisional application No. 60/668,637, filed on Apr. 6, 2005.

(51) Int. Cl.
*H03D 3/06* (2006.01)
(52) U.S. Cl. ......................... 329/339; 329/315; 329/340
(58) Field of Classification Search ................. 329/315, 329/339, 340
See application file for complete search history.

(56) References Cited

U.S. PATENT DOCUMENTS

| | | | |
|---|---|---|---|
| 2,379,748 A | * | 7/1945 | Roberts ...................... 329/315 |
| 2,926,316 A | * | 2/1960 | Rae-Fraser ................... 333/177 |
| 4,193,033 A | | 3/1980 | Voorman |
| 5,017,841 A | | 5/1991 | Miura |
| 5,341,107 A | | 8/1994 | Bijker et al. |

OTHER PUBLICATIONS

Kennedy, "Electronic Communication Systems", 1977, McGrow Hill, Second Edition, pp. 189-201.*

* cited by examiner

*Primary Examiner*—Joseph Chang
(74) *Attorney, Agent, or Firm*—Francissen Patent Law, P.C.; Vernon W. Francissen (57) ABSTRACT

A circuit and method for differential slope demodulator circuit are shown that utilize amplitude stabilizing of a frequency modulated signal to obtain an amplitude stabilized signal. Also shown is bandpass filtering of the amplitude stabilized signal for a first frequency that is offset by a shift frequency below an intermediate frequency, to obtain a first filtered signal and bandpass filtering the amplitude stabilized signal for a second frequency that is offset by the shift frequency above the intermediate frequency, to obtain a second filtered signal. The circuit and method further operate by detecting an envelope of the first filtered signal to obtain a first envelope signal, detecting an envelope of the second filtered signal to obtain a second envelope signal, and differencing the first and second envelope signals to obtain a demodulated output signal.

9 Claims, 6 Drawing Sheets

DIFFERENTIAL SLOPE DEMODULATOR FOR LOW-IF FREQUENCIES

CROSS-REFERENCE TO RELATED APPLICATION

This application claims priority to U.S. provisional application No. 60/668,922 entitled DIFFERENTIAL SLOPE FM DEMODULATOR FOR LOW-IF FREQUENCIES filed Apr. 6, 2005, herein incorporated by reference in its entirety for all purposes. This application is related to commonly owned U.S. provisional application No. 60/668,637 entitled CIRCUIT AND METHOD FOR SIGNAL RECEPTION USING A LOW INTERMEDIATE FREQUENCY filed Apr. 6, 2005, and corresponding U.S. patent application Ser. No. 11/391,991 herein incorporated by reference in their entirety for all purposes.

FIELD OF THE INVENTION

Single chip receivers can be made low cost and small size when the selectivity filter and the demodulator are completely integrated on the chip. To obtain reasonable power consumption, required for longer battery life, in an intermediate frequency (IF) solution, the intermediate frequency (IF) is chosen to be relatively low, e.g. 200 kHz. Prior art low-IF FM demodulators are often based on a quadrature detector, such as the one shown in U.S. Pat. No. 5,341,107, or a phase locked loop (PLL), see U.S. Pat. No. 5,017,841 and "A digitally programmable zero external components FM radio receiver with 1 uV sensitivity," H. van Rumpt, W. G. Kasperkovitz and J van der Tang, ISSCC 2003.

A quadrature detector has a phase shifter and a phase detector. The phase detector detects the phase difference between the signal phase at the input of the phase shifter and the signal phase at the output of the phase shifter. Since the input of the phase shifter comes mostly from a limiter circuit (to remove amplitude variations) the generated harmonics will also be present at the output of the demodulator. These harmonics need to be filtered to protect the successive circuitry such as stereo decoder and audio amplifier. Another drawback of the harmonics is the potential problem of intermodulation: the harmonics at the demodulator output interfere with the demodulated baseband (audio) signal. For low distortion, the quadrature demodulator needs a loop filter, which results in the cost of extra chip area.

A PLL demodulator has a phase detector that is also typically connected to the output of a limiter circuit. Again, the generated harmonics are transferred to the output of the demodulator. A known way to mitigate this problem is to replace the limiter by an Automatic Gain Controlled (AGC) amplifier, as demonstrated in U.S. Pat. No. 5,017,841 and by van Rumpt et al. Two loop filters are typically required, one for the AGC and one for the PLL.

SUMMARY OF THE INVENTION

An exemplary embodiment of a differential slope demodulator circuit includes an amplitude stabilizer having an input and an output. A first filter has an input coupled to the output of the amplitude stabilizer and an output, where the first filter is tuned to a first frequency that is offset by a shift frequency below an intermediate frequency for the demodulator circuit. A second filter has an input coupled to the output of the amplitude stabilizer and an output, where the second filter is tuned to a second frequency that is offset by the shift frequency above the intermediate frequency for the demodulator circuit. A first envelope detector has an input coupled to the output of the first filter and an output and a second envelope detector has an input coupled to the output of the second filter and an output. And a subtractor having a first input coupled to the output of the first envelope detector, a second input coupled to the output of the second envelope detector, and an output.

An embodiment of a method for differential slope demodulation of a frequency modulated signal alls for amplitude stabilizing the frequency modulated signal to obtain an amplitude stabilized signal. The method further calls for filtering the amplitude stabilized signal for a first frequency that is offset by a shift frequency below an intermediate frequency, to obtain a first filtered signal and filtering the amplitude stabilized signal for a second frequency that is offset by the shift frequency above the intermediate frequency, to obtain a second filtered signal. The method also recites detecting an envelope of the first filtered signal to obtain a first envelope signal and detecting an envelope of the second filtered signal to obtain a second envelope signal. Further, the method includes differencing the first and second envelope signals to obtain a demodulated output signal.

BRIEF DESCRIPTION OF THE DRAWINGS

Certain exemplary embodiments of the present invention will be described with respect to the following drawings, wherein.

DETAILED DESCRIPTION OF THE INVENTION

A differential slope demodulator is presented that has low distortion and inherent suppression of IF (Intermediate Frequency) harmonics even at low-IF frequencies. In contrast to other low-IF demodulators, this approach does not require a loop filter and has intrinsic capabilities to equalize the frequency response of the IF filter to reduce distortion. The differential slope demodulation described herein may be applied to the demodulation of frequency modulated signals, such as frequency modulated (FM) and frequency shift keyed (FSK) signals.

In one aspect of the present invention, filtering is performed on the harmonics that occur inherently within the demodulator so that the amount of filtering after the demodulator can be reduced significantly and a loop filter can be omitted. Chip area and current consumption may also be saved. In another aspect, distortion caused by group-delay variation in the intermediate frequency (IF) selectivity filter is reduced. The present invention may permit integration of the circuit on silicon, provide for low distortion at low IF, allow high production yield, and provide good matching with an integrated IF filter.

By adopting a differential architecture, the invention improves on the distortion properties of the traditional frequency modulation (FM) slope demodulator.

Figure 1:
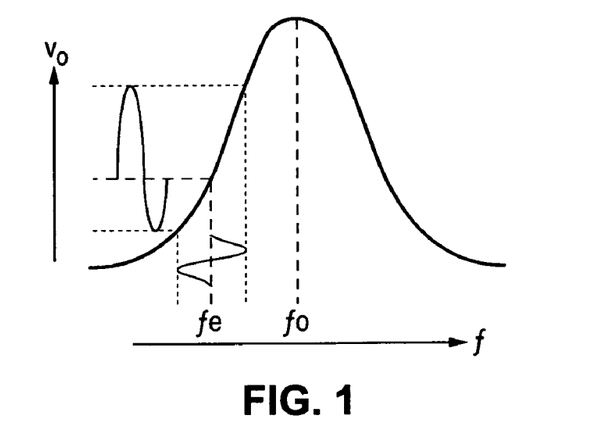
FIG. 1 is a frequency response graph illustrating tuned circuit transfer characteristics for resonator tuning.

FM slope demodulators have been known for more than sixty years. It is, perhaps, the simplest FM demodulator. A filter circuit, typically a resonator, is tuned so that the carrier of the FM signal (fc) is at the slope of the resonator. See the frequency response graph illustrating tuned circuit transfer characteristics for resonator tuning in FIG. 1. FIG. 1 is a frequency response graph illustrating tuned circuit transfer characteristics for resonator tuning. In FIG. 1, the amplitude of the envelope is shown as a function of the frequency modulation. In fact, the transfer function of FIG. 1 indicates that the FM of the carrier frequency $f_C$ is converted to AM (Amplitude modulation) of the output voltage $V_O$.

Figure 2:
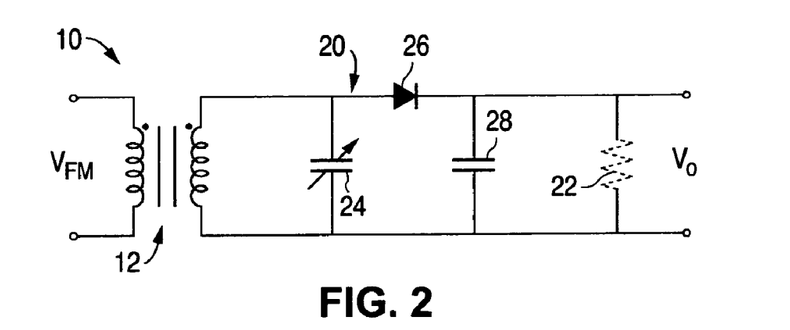
FIG. 2 is a circuit diagram illustrating an example of a slope detector circuit.

An example of an FM slope demodulator circuit 10 is shown in FIG. 2. Transformer 12 receives a frequency modulated voltage signal $V_{FM}$ and transfers the signal to an LC resonator 20 in the circuit 10. A coil of transformer 12 provides an inductance, e.g. the L, for the LC resonator portion 20. Variable capacitor 24 is coupled to transformer and provides the reactance, e.g. the C, for the LC resonator 20. Diode 26 rectifies the signal so that the circuit detects the amplitude of the envelope that follows the LC resonator. The high frequency components of the rectified signal are filtered by the fixed capacitor 28 in combination with resistor 22 to produce the output voltage $V_O$.

For low IF frequencies, the FM slope demodulator has poor performance. The second harmonic due to the rectifier is present at the output. At low IF, the highest modulation frequency is not much lower than the IF, hence the filter at the output has very limited suppression of IF and IF harmonics. Another drawback is the non-linear distortion due to the non-linear frequency-to-amplitude response at the slope of the resonator—note the distortion in $V_O$ shown in FIG. 1.

Figure 3:
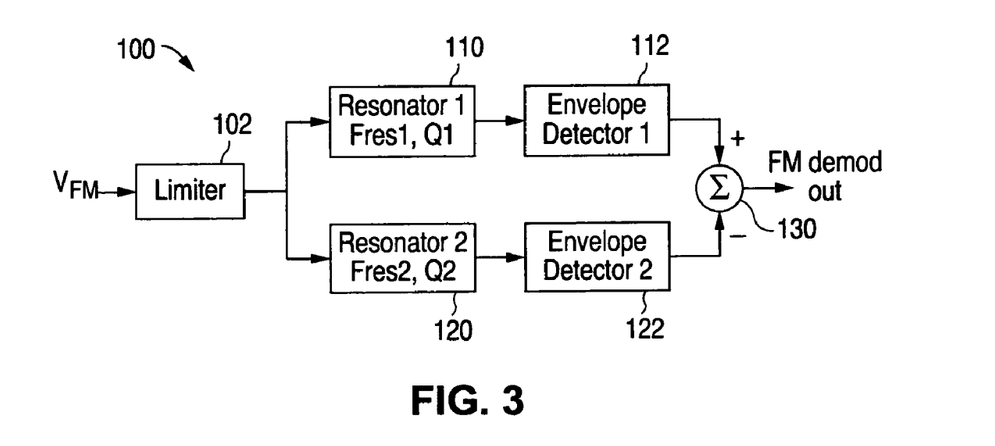
FIG. 3 is a functional block diagram illustrating an embodiment of a differential slope demodulator.

With the present invention, both the distortion and the IF related content is significantly reduced. Two "de-tuned" resonator filters are used to create a differential frequency to amplitude conversion. FIG. 3 is a functional block diagram illustrating an exemplary embodiment of a differential slope FM demodulator 100 according to the present invention. In demodulator 100, the output of a limiter 102 is coupled to a first resonator 110 with a first resonant frequency $F_{res1}$ and Q1. Resonator 110 is coupled in series with envelope detector 112 between the output of limiter 102 and subtractor 130. Similarly, a second resonator 120 with a second resonant frequency $F_{res2}$ and Q2 is also coupled in series with envelope detector 122 between the output of limiter 102 and subtractor 130. Note that limiter 102 is one implementation of an amplitude stabilizer, which can be realized in a variety of ways, such as by a limiter, as in the embodiments discussed here, or by a variable gain amplifier that is controlled by an automatic gain control loop.

The FM signal $V_{FM}$ enters the demodulator at the limiter input. The limiter 102 removes unwanted amplitude variation. The resonance frequency of resonator 110 is tuned higher than the carrier at the input and performs bandpass filtering around this higher frequency. Resonator 120 is tuned to a lower frequency and performs bandpass filtering around this lower frequency. While the preferred embodiments are bandpass filters, other types of filters may be utilized provided that the slope of the filter response is selected so that the center frequency is positioned on the slope of the filter response. An increase of the instantaneous frequency of the FM signal causes the amplitude at the output of resonator 110 to rise while resonator 120 generates a fall in amplitude, hence the output level of the subtractor 130 increases. A decrease of the instantaneous frequency of the FM or FSK signal causes the amplitude at the output of resonator 120 to increase while resonator 110 generates a fall in amplitude, hence the output level of the subtractor 130 decreases. Consequently, the resonators 110 and 112 filter and convert the frequency modulated signals to an amplitude modulated signals. Envelope detectors 112 and 122 then convert, e.g. rectify, the amplitude modulated signals to baseband signals. The baseband signals are subtracted to obtain the data signal. This architecture can be extended with more than two resonators and more than two envelope detectors.

Figure 4:
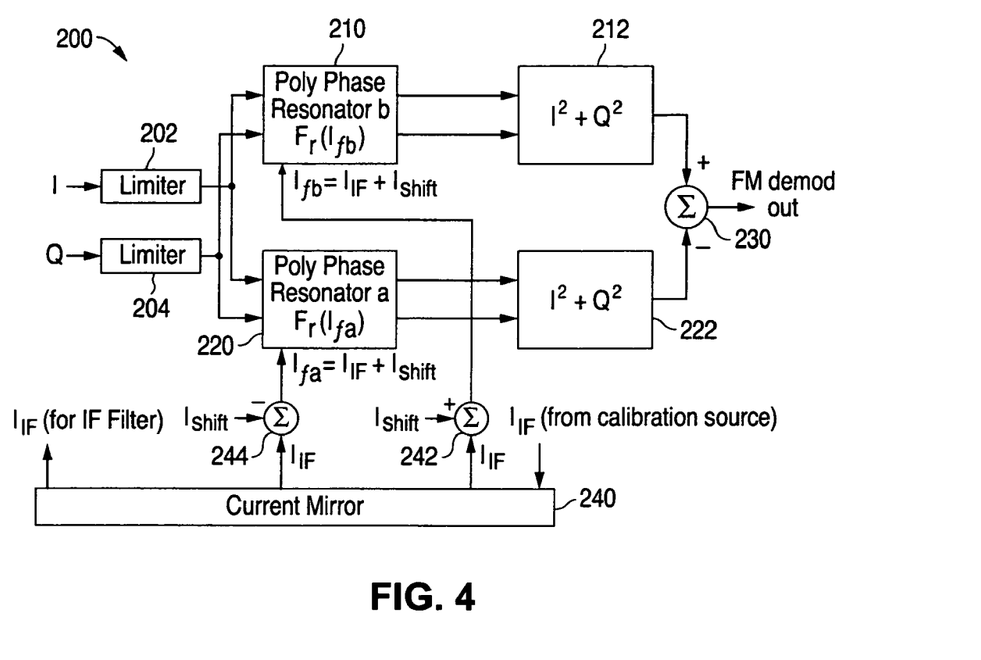
FIG. 4 is a functional block diagram illustrating another embodiment of a differential slope demodulator for low-IF frequencies.

FIG. 4 is a functional block diagram illustrating another embodiment of a differential slope FM demodulator 200 for low-IF frequencies. In this embodiment, the resonators are implemented by a pair of poly phase filters 210 and 220 that are driven by a poly phase IF signal I and Q input to limiters 202 and 204. The outputs of polyphase filters 210 and 220 are input to adders 212 and 222, respectively, which squares the filtered I and Q signals and adds the result. The output of adders 212 and 222 is differenced by subtractor 230. A current mirror circuit 240 receives a calibrated $I_{IF}$ current from a calibrated current source and generates images of the $I_{IF}$ for use by polyphase filters 210 and 220 and an IF filter. One $I_{IF}$ current image is input to current summer 242, where it is summed with a shift current $I_{SHIFT}$ to produce current $I_{fb}$ for input to polyphase filter 210. Another $I_{IF}$ current image is input to current summer 244, where the shift current $I_{SHIFT}$ is subtracted from it to produce current $I_{fa}$ for input to polyphase filter 220. See commonly owned, co-pending U.S. patent application Ser. No. 11/211,262 for a "Tunable Poly-phase Filter and Method for Calibration Thereof" filed Aug. 25, 2005, herein incorporated by reference in its entirety, for an example how to generate $I_{IF}$ for the present embodiments.

The embodiment of FIG. 4, has several advantages. The frequency-to-amplitude conversion curve at the positive slope (i.e. lower than the resonance frequency) is the same as on the negative slope (i.e. higher than the resonance frequency). This results in a lower distortion level because the curve slopes are the same. Also, low IF related content at the output of subtractor 230 can be obtained due to quadrature envelope detection by quadrature envelope detectors 212 and 222. Further, resonators 210 and 220 can be frequency matched to a poly phase IF selectivity filter 400 that may be coupled to the demodulator circuit 200 before limiters 202 and 204. By using a poly-phase filter for an IF selectivity filter, frequency matching the resonators 210 and 220 with IF selectivity filter 400 can be achieved by adjusting $I_{IF}$ for the IF selectivity filter and using the calibrated $I_{IF}$ current to control the frequency of resonators 210 and 220. See the tunable poly-phase filter described in commonly assigned, co-pending U.S. patent application Ser. No. 11/211,262.

In analog implementations of the present invention, the poly phase resonator is preferably implemented using a gyrator circuit because of its superior tuning capabilities. Examples of gyrator circuits are shown in U.S. Pat. No. 4,193,033 and in U.S. provisional patent application No. 60/668,637 for a Circuit and Method for Signal Reception Using a Low Intermediate Frequency Reception filed Apr. 6, 2005. Also, other types of poly phase resonators can be used. In this preferred embodiment, the tuning currents $I_{fa}$ and $I_{fb}$ determine the resonance frequencies of the poly phase resonators 210 and 220. Excellent receiver performance can be obtained when the IF selectivity filter is built with poly phase resonators that are matched to those used in the demodulator.

The envelope detectors 212 and 222 are implemented by the square sum of the outputs of the poly phase resonators 210 and 220, respectively. The envelope detectors generally convert the amplitude modulated signal output by the poly phase resonators 210 and 220 into baseband signals. In this embodiment, envelope detectors 212 and 222 perform a squaring function, e.g. $I^2+Q^2$, and produce an output that is quadratically proportional to the amplitude. Alternatively, a square root function could be implemented, e.g. $SQRT(I^2+Q^2)$, with the circuit parameters adapted accordingly. Both the I and Q phase channels are filtered by the resonators 210 and 220. After filtering by the resonators, an approximation of $(A \cdot sine)^2+(A \cdot cosine)^2=A^2$ is performed by the envelope detectors 212 and 222, where the constant A represents the amplitude of the signal after the resonator filters 210 and 220. Such a quadratic envelope detector is relatively simple to implement on silicon. For example, a linearized Gilbert multiplier can perform the squaring function for each of the I and Q channels and the current outputs of the multipliers for the I and Q channels can be connected such that addition is obtained. Alternatively, one of the inputs to the envelope detectors 212 and 222 can be clipped, e.g. controlled to a fixed amplitude, so that an output is generated that is linearly proportional to the input amplitude.

Figure 5:
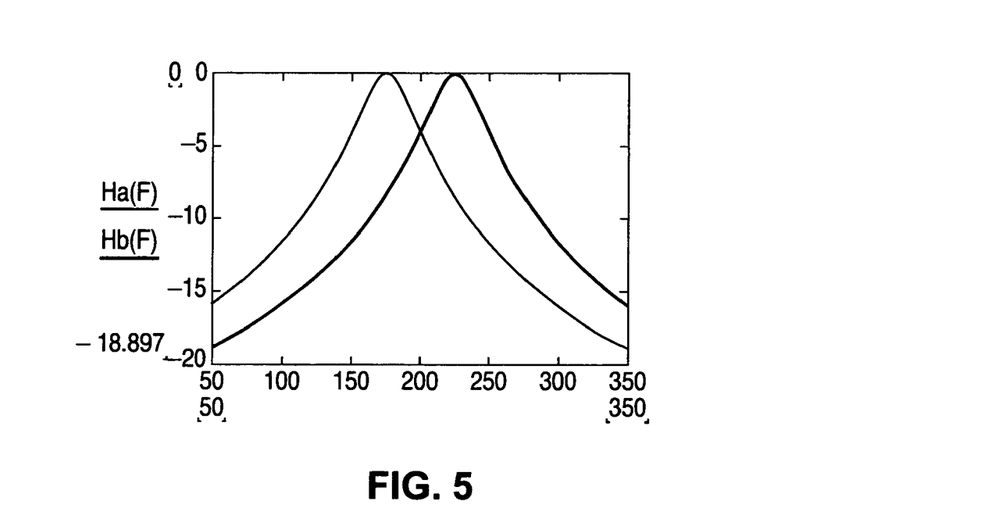
FIG. 5 is a frequency response graph illustrating an example of the frequency responses of the poly phase resonators of FIG. 4.
Figure 6:
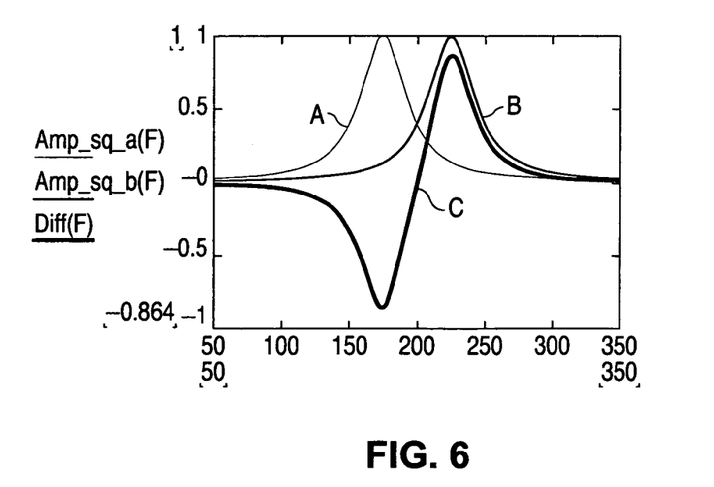
FIG. 6 is a frequency response graph illustrating examples of the output generated after envelope detection and the demodulator output of the circuit of FIG. 4, when the circuit is adapted to demodulate an FM signal.

FIG. 5 is a frequency response graph illustrating a response of the poly phase resonators 210 and 220 of FIG. 4. In this example, the Intermediate Frequency is 200 kHz. FIG. 6 is a frequency response graph illustrating the outputs of envelope detectors 210 and 220 and subtractor 230. In FIG. 6, the dashed line A with the leftmost peak represents the output of envelope detector 222, which is coupled to the lower tuned resonator 220. The dashed line B with the rightmost peak represents the output of envelope detector 212, which is coupled to the higher tuned resonator 210. The solid line C is the difference between the two dashed curves A and B and shows the S-curve of the output of subtractor 230. Note that the resulting curve C has a highly linear slope around the center frequency $f_C$, which is 200 kHz in the example shown.

Around the center frequency, e.g. 200 kHz in this example, the demodulator output is quite linear. The subtractor 230 typically has low second order distortion.

By shifting the resonators "apart", e.g. separating the resonant frequencies, the demodulator group-delay at $IF+/-F_{shift}$ is higher than at the center frequency (IF). This capability can be utilized to equalize, at least in part, the group-delay variation caused by the IF selectivity filter, which may be coupled to the input of the FM slope demodulator circuits 100 and 200.

Typical parameter values for a differential slope demodulator used to detect FM signals are:

$F_{shift}$=resonance frequency shift with respect to the carrier at IF;
Bw=bandwidth of each resonator (both resonators have preferably the same Bw);
Fdev=deviation of the FM signal;
where Fshift~2×Fdev;
Bw~K×Fshift, at K=2 the derivative of the demodulator gain (S-curve) is flat around the IF. If K is lower than 2 the gain at Fshift/2 is getting higher than the gain at around IF; and
K is typically chosen between 1.6 and 2.

In contrast to the PLL and the quadrature demodulator, the differential slope demodulator filters the IF related frequencies within the demodulator function. Consequently, the requirements for post demodulator filtering are substantially relaxed, which can reduce chip area and current consumption for the overall circuit.

Figure 7:
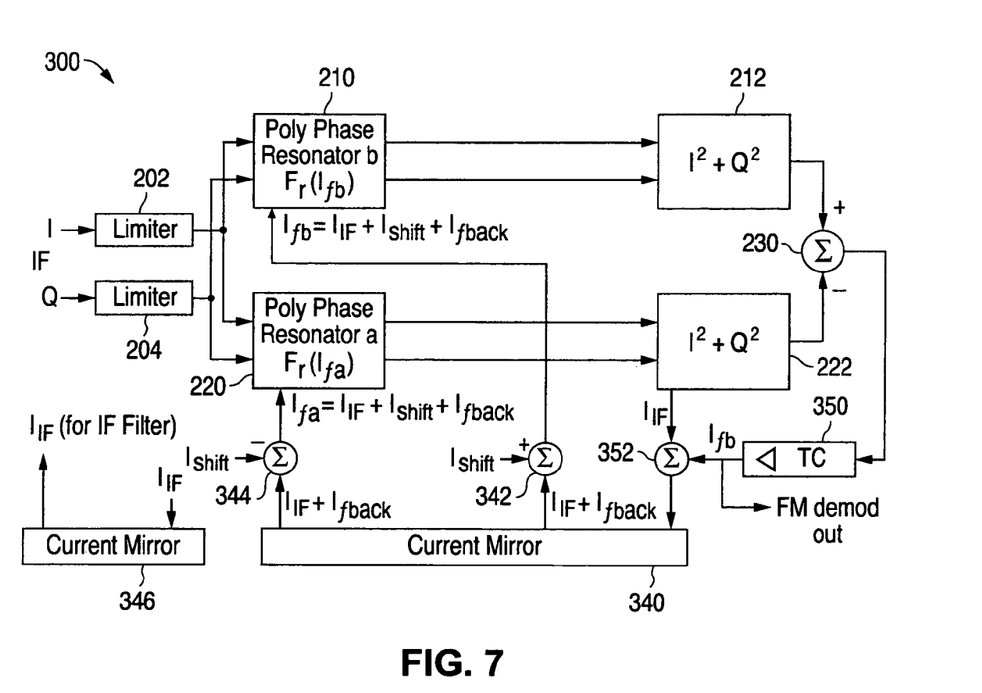
FIG. 7 is a functional block diagram illustrating another embodiment of a differential slope demodulator for low-IF frequencies that includes resonance frequency tracking.

To minimize the distortion, the resonance frequency of both resonators can be tracked with the FM signal, as demonstrated in the embodiment of a demodulator circuit 300 shown in FIG. 7. In the embodiment of FIG. 7, the output of subtractor 230 is input to a transconductance circuit 350, which outputs a feedback current $I_{fback}$. The feedback current $I_{fback}$ is summed with the reference current $I_{IF}$ and input to current mirror 340, which generates mirrored currents $I_{IF}+I_{fback}$ for input to summers 342 and 344. The output of summers 342 and 344, in turn, tunes the resonant frequency of resonators 210 and 220. Summer 342 adds shift current $I_{shift}$ to produce $I_{fb}=I_{IF}+I_{shift}+I_{fback}$ for input to resonator 210. Summer 344 subtracts shift current $I_{shift}$ to produce $I_{fa}=I_{IF}-I_{shift}+I_{fback}$ for input to resonator 210.

Transconductor 350 is used to create a closed loop so that the center frequency of the FM demodulator circuit 300 tracks the frequency modulation of the incoming signal. In this feedback loop embodiment, the resonators 210 and 220 can also perform loop filtering, e.g. second order low-pass, such that no additional loop filter may be required. This is in contrast to other closed loop demodulator circuits, like the PLL and the quadrature tracking demodulator approaches discussed above. Avoiding the use of loop filters can further reduce chip area and current consumption.

Due to the second order loop, some ringing can occur. However, the amount of ringing can be controlled by adjusting the transconductor gain of transconductor circuit 350 and can be utilized to compensate for the roll-off due to IF selectivity filtering.

Due to the linearization, obtained by the frequency tracking of the closed loop, the K factor (Bw/Fshift) can be increased. Typical values are between 2 and 4.

Figure 8:
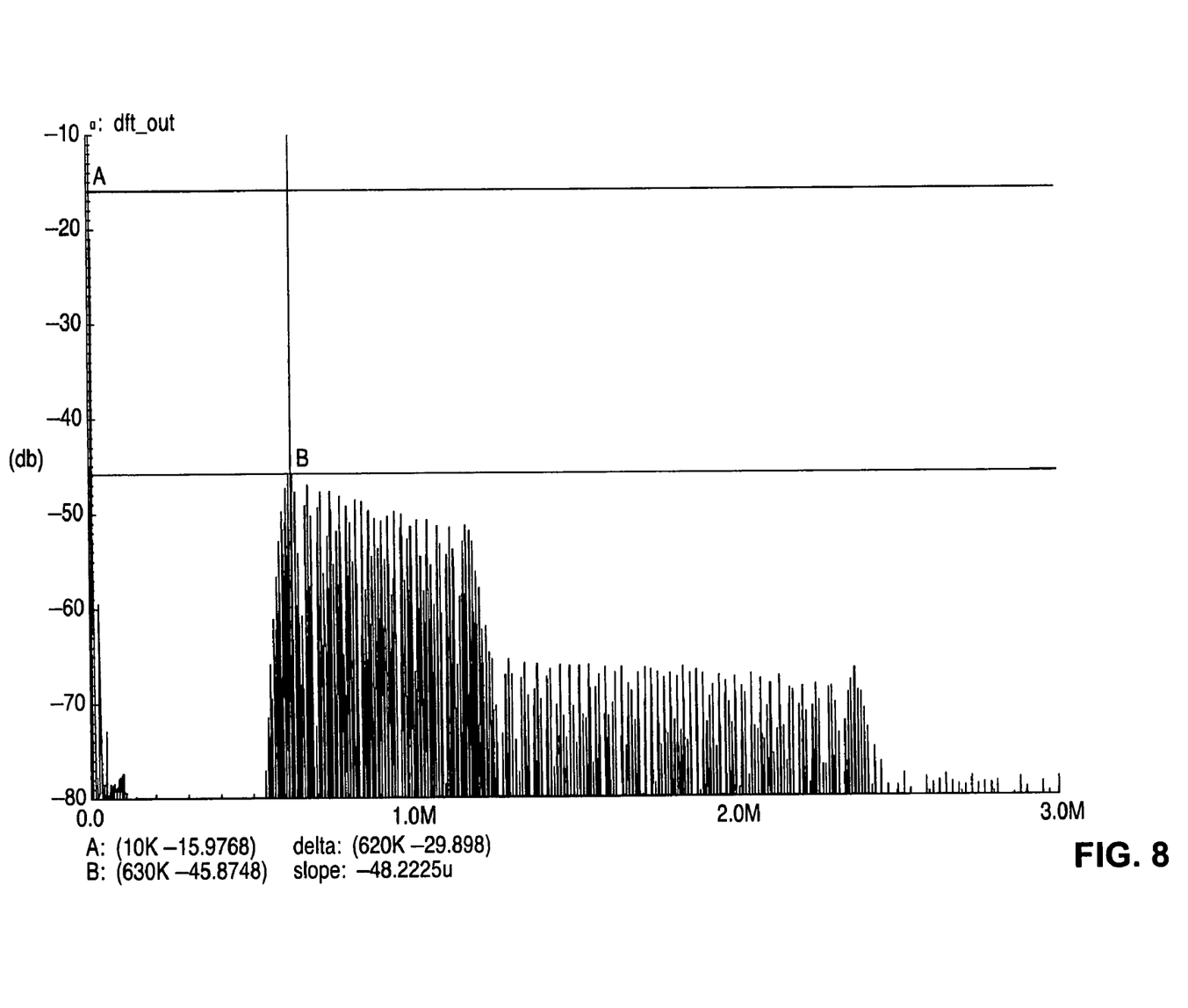
FIG. 8 is a frequency response graph illustrating an example of the output spectrum of the demodulator circuit of FIG. 7 without post filtering.

FIG. 8 is a frequency response plot that shows the results of a system simulation of the demodulator output spectrum for the embodiment of FIG. 7. The following settings were used: IF=225 kHz, Bw=80 kHz, Fshift=25 kHz (K=3.2), open-loop gain=8.1. The FM signal at the input: deviation=75 kHz, modulation=1 kHz sine-wave. FIG. 8 shows that the first and second harmonic of the IF signal are canceled within the demodulator circuit. The fourth harmonic is present but suppressed by ~30 dB.

The present invention may also be applied to frequency shift keying (FSK) techniques, which is another form of frequency modulation where a binary signal is used to modulate the frequency of the transmitted signal. For FSK applications, a linear slope around the carrier frequency is typically less desirable because the binary signal is the signal of interest. Typical parameter values for FSK demodulation are: Fshift=Fdeviation; Bw=Bit-rate of the FSK signal. Note that for a low bit-rate application, the Bw can be smaller and better noise filtering obtained resulting in improved sensitivity.

Figure 9:
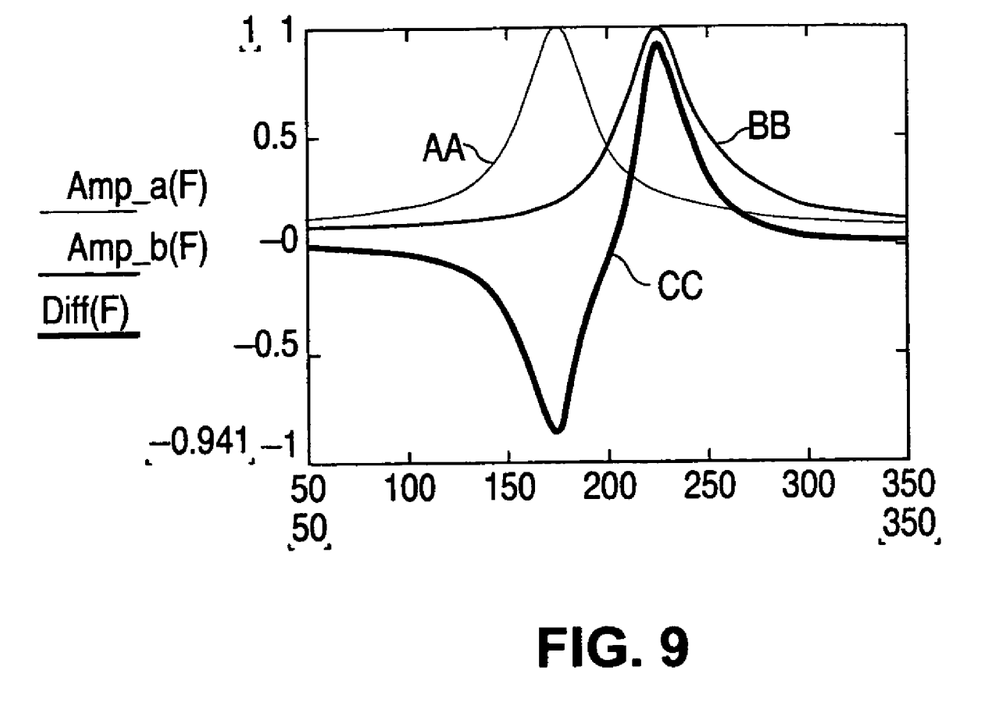
FIG. 9 is a frequency response graph illustrating examples of the output generated after envelope detection and the demodulator output of the circuit of FIG. 4 when the circuit is adapted to demodulate an FSK signal.

FIG. 9 is a frequency response graph illustrating the outputs of envelope detectors 210 and 220 and subtractor 230 of FIG. 4, when these components are designed for an FSK application. In FIG. 9, the dashed line AA with the leftmost peak represents the output of envelope detector 222, which is coupled to the lower tuned resonator 220. The dashed line BB with the rightmost peak represents the output of envelope detector 212, which is coupled to the higher tuned resonator 210. The solid line CC is the difference between the two dashed curves AA and BB and shows the S-curve of the output of subtractor 230. Note that the resulting curve CC does not have a linear slope around the center frequency fc, which is 200 kHz in the example shown. This may be compared to the linear response shown in FIG. 6, which illustrates a response adapted for FM rather than FSK applications. In this example, the frequency shift Fshift is 25 and the bandwidth Bw=25. In contrast, the response shown in FIG. 6 has Bw=50. The reduced bandwidth of the FSK application improves the sensitivity threshold of the demodulator.

Note that one or more blocks of the embodiments described above can be implemented as digital signal processing blocks without departing from the teachings of the present invention. For example, the amplitude stabilization, filtering, envelope detection, summing or differencing functions may be performed by a digital signal processor (DSP). The resonators described above may be implemented as bandpass filter blocks.

Figure 10:
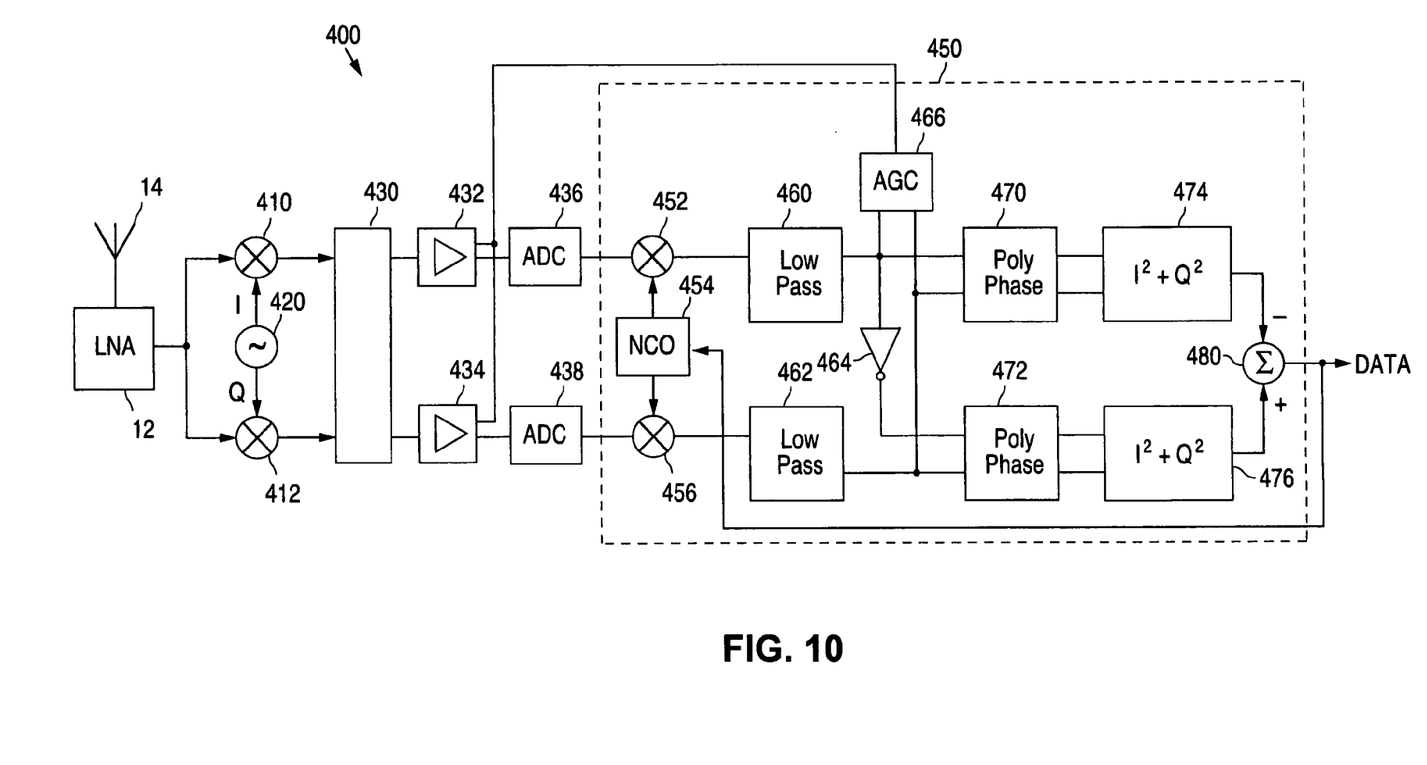
FIG. 10 is a simplified block diagram illustrating an example of a digital signal processor (DSP) based embodiment of a differential slope demodulator.

FIG. 10 is a simplified block diagram illustrating an example of a digital signal processor (DSP) based embodiment of a differential slope demodulator. In the circuit 400 of FIG. 10, a low noise amplifier (LNA) 12 receives a radio frequency signal via antenna 14 and outputs the received signal to first and second multipliers 410 and 412 to obtain an I channel and a Q channel from the received signal. Voltage controlled oscillator (VCO) 420 generates I and Q clock phase signals that are also input to multipliers 410 and 412. VCO 420 is tuned to the desired channel frequency plus or minus the Intermediate Frequency (IF) and produces in-phase I and quadrature-phase Q clock outputs.

The I and Q channels output by multipliers 410 and 412 are input to a poly-phase anti-aliasing filter 430, which filters the I and Q channels and then outputs the filtered channels to amplitude stabilizers 432 and 434, which are limiters in one embodiment. The amplitude stabilized I and Q channels are then input to analog to digital converters (ADCs) 436 and 438, which convert the analog I and Q channel signals into digital I and Q channels for input to DSP 450.

In one embodiment, the amplitude stabilizers 432 and 434 are variable gain devices whose gain is controlled by DSP 450. In DSP 450, the output of filter functions 460 and 464 is input to an automatic gain control function 466 that generates a gain control signal that controls devices 432 and 434.

DSP 450 digitally processes the I and Q channels by performing the functions indicated by the functional symbols illustrated within DSP 450. However, the symbolic functions are here performed by DSP functions in combination with the DSP hardware. The digital I and Q channels are digitally mixed with frequency phase signals generated by a numerically controlled oscillator (NCO) function 454, as illustrated by mixer symbols 452 and 456. The NCO may optionally receive feedback of the output data signal to modify the phase signals. The digital I and Q channels are, in this embodiment, selectivity or channel filtered using low pass filter functions 460 and 462. The channel filtered I and Q channels are then poly-phase filtered 470 and 472 to filter and convert the digital frequency modulated I and Q channels to amplitude modulated signals.

The filter functions 470 and 472 are detuned from the expected intermediate frequency by the expected shift frequency. While filter functions 470 and 472 are preferably bandpass functions, other filter functions, e.g. low and high pass, may be utilized provided that the slope of the filter function is selected such that the center frequency is positioned on the slope. Filter functions 470 and 472 produce digital amplitude modulated I and Q outputs that are converted to baseband signals by envelope detection functions 474 and 476. The channel filtered I channel is inverted and then poly-phase filtered 470 with the filtered Q channel to generate I and Q outputs that are envelope detected 476. The poly-phase filtering functions 470 and 472 are, in this example, band pass filter functions that have the same center frequency, but function 470 is effectively tuned to the lower side band, while function 472 is effectively tuned to the upper side band due to inverter function 464. For an FSK receiver, the center frequency is the frequency difference between the frequency shifts that encode the data bits. The envelope detection functions, in this example, are $I^2+Q^2$. Subtractor function 480 subtracts the envelope detected baseband signal produced by function 474 from the envelope detected baseband signal produced by function 476 in order to produce a DATA output from DSP 450. In one embodiment, the DATA signal is fed back to NCO 454.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Certain embodiments of this invention are described herein, including the best mode known to the inventors for carrying out the invention. It should be understood that the illustrated embodiments are exemplary only, and should not be taken as limiting the scope of the invention.

I claim:

1. A differential slope demodulator circuit, the circuit comprising:

an amplitude stabilizer having an input and an output;

a first filter having an input coupled to the output of the amplitude stabilizer and an output, where the first filter is tuned to a first frequency that is offset by a shift frequency below an intermediate frequency for the demodulator circuit;

a second filter having an input coupled to the output of the amplitude stabilizer and an output, where the second filter is tuned to a second frequency that is offset by the shift frequency above the intermediate frequency for the demodulator circuit;

a first envelope detector having an input coupled to the output of the first filter and an output;

a second envelope detector having an input coupled to the output of the second filter and an output; and a subtractor having a first input coupled to the output of the first envelope detector, a second input coupled to the output of the second envelope detector, and an output, and wherein:

the amplitude stabilizer further comprises:
- an I channel amplitude stabilizer having an input for receiving an I channel of the demodulator circuit and an output, and
- a Q channel amplitude stabilizer having an input for receiving a Q channel of the demodulator circuit and an output;

the first filter further comprises a first poly-phase resonator having a first input coupled to the output of the I channel amplitude stabilizer and a second input coupled to the output of the Q channel amplitude stabilizer, first and second outputs, and a current input;

the second filter further comprises a second poly-phase resonator having a first input coupled to the output of the I channel amplitude stabilizer and a second input coupled to the output of the Q channel amplitude stabilizer, first and second outputs, and a current input;

the first envelope detector further comprises a first quadrature envelope detector having a first input coupled to the first output of the first poly-phase resonator, a second input coupled to the second output of the first poly-phase resonator, and an output coupled to the first input of the subtractor;

the second envelope detector further comprises a second quadrature envelope detector having a first input coupled to the first output of the second poly-phase resonator, a second input coupled to the second output of the second poly-phase resonator, and an output coupled to the second input of the subtractor;

a first current summer having a first input for receiving a current corresponding to the intermediate frequency, a second input for receiving a current corresponding to the shift frequency and an output coupled to the current input of the first filter, where the first current summer is configured to add the currents at the first and second inputs and output a sum current; and a second current summer having a first input for receiving the current corresponding to the intermediate frequency, a second input for receiving the current corresponding to the shift frequency and an output coupled to the current input of the second filter, where the second current summer is configured to subtract the current the second input from the current at the first input and output a difference current.

2. The differential slope demodulator circuit of claim 1, the circuit further comprising a current mirror circuit having an input for receiving the current corresponding to the intermediate frequency, a first output coupled to the first input of the first current summer and a second output coupled to the first input of the second current summer, where the current mirror circuit, is configured to generate mirror currents at the first and second outputs of the current mirror circuit that are proportional to the current corresponding to the intermediate frequency received at the input of the current mirror circuit.

3. The differential slope demodulator circuit of claim 2, where:
the circuit further includes a poly-phase intermediate frequency selectivity filter having first and second inputs, a first output coupled to the input of the I channel amplitude stabilizer, a second output coupled to the input of the Q channel amplitude stabilizer, and a current input; and the current mirror circuit includes a third output coupled to the current input of the poly-phase intermediate frequency selectivity filter.

4. The differential slope demodulator circuit of claim 2, the circuit further comprising:
- a transconductor circuit having an input coupled to the output of the subtractor and an output; and
- a third current summer having a first input for receiving the current corresponding to the intermediate frequency, a second input coupled to the output of the transconductor circuit, and an output coupled to the input of the current mirror circuit.

5. The differential slope demodulator circuit of claim 4, where the circuit further includes:
- a poly-phase intermediate frequency selectivity filter having first and second inputs, a first output coupled to the input of the I channel amplitude stabilizer, a second output coupled to the input of the Q channel amplitude stabilizer, and a current input; and
- another current mirror circuit having an input for receiving the current corresponding to the intermediate frequency and a first output coupled to the current input of the poly-phase intermediate frequency selectivity filter, where the another current mirror circuit is configured to generate a current at the first output of the another current mirror circuit that is proportional to the current corresponding to the intermediate frequency received at the input of the another current mirror circuit.

6. A method for differential slope demodulation of a frequency modulated signal, the method comprising the steps of:
- amplitude stabilizing the frequency modulated signal to obtain an amplitude stabilized signal;
- filtering the amplitude stabilized signal for a first frequency that is offset by a shift frequency below an intermediate frequency, to obtain a first filtered signal;
- filtering the amplitude stabilized signal for a second frequency that is offset by the shift frequency above the intermediate frequency, to obtain a second filtered signal;
- detecting an envelope of the first filtered signal to obtain a first envelope signal;
- detecting an envelope of the second filtered signal to obtain a second envelope signal;
- differencing the first and second envelope signals to obtain a demodulated output signal; and wherein:

the step of amplitude stabilizing the frequency modulated signal further comprises:
- amplitude stabilizing an I channel of the frequency modulated signal to obtain a amplitude stabilized I channel signal, and
- amplitude stabilizing a Q channel of the frequency modulated signal to obtain a amplitude stabilized Q channel signal;

the step of filtering the amplitude stabilized signal for a first frequency further comprises:
- filtering the amplitude stabilized I channel signal for the first frequency to obtain a first frequency filtered I channel signal, and
- filtering the amplitude stabilized Q channel signal for the first frequency to obtain a first frequency filtered Q channel signal;

the step of filtering the amplitude stabilized signal for a second frequency further comprises:

filtering the amplitude stabilized I channel signal for the second frequency to obtain a first frequency filtered I channel signal, and filtering the amplitude stabilized Q channel signal for the second frequency to obtain a first frequency filtered Q channel signal;

the step of detecting an envelope of the first filtered signal to obtain a first envelope signal further comprises quadrature detecting the envelope of the first frequency filtered I channel signal and first frequency filtered Q channel signal to obtain the first envelope signal; and the step of detecting an envelope of the second filtered signal to obtain a second envelope signal further comprises quadrature detecting the envelope of the second frequency filtered I channel signal and second frequency filtered Q channel signal to obtain the second envelope signal.

7. A method for differential slope demodulation of a frequency modulated signal, the method comprising the steps of:

amplitude stabilizing the frequency modulated signal to obtain an amplitude stabilized signal;

filtering the amplitude stabilized signal for a first frequency that is offset by a shift frequency below an intermediate frequency, to obtain a first filtered signal;

filtering the amplitude stabilized signal for a second frequency that is offset by the shift frequency above the intermediate frequency, to obtain a second filtered signal;

detecting an envelope of the first filtered signal to obtain a first envelope signal;

detecting an envelope of the second filtered signal to obtain a second envelope signal;

differencing the first and second envelope signals to obtain a demodulated output signal;

generating mirror currents that are proportional to a current corresponding to the intermediate frequency; and controlling the first and second frequencies using the mirror currents.

8. A method for differential slope demodulation of a frequency modulated signal, the method comprising the steps of:

amplitude stabilizing the frequency modulated signal to obtain an amplitude stabilized signal;

filtering the amplitude stabilized signal for a first frequency that is offset by a shift frequency below an intermediate frequency, to obtain a first filtered signal;

filtering the amplitude stabilized signal for a second frequency that is offset by the shift frequency above the intermediate frequency, to obtain a second filtered signal;

detecting an envelope of the first filtered signal to obtain a first envelope signal;

detecting an envelope of the second filtered signal to obtain a second envelope signal;

differencing the first and second envelope signals to obtain a demodulated output signal;

converting the demodulated output signal to a feedback current; and the step of generating mirror currents that are proportional to a current corresponding to the intermediate frequency includes adding the feedback current to the current corresponding to the intermediate frequency.

9. A method for differential slope demodulation of a frequency modulated signal, the method comprising the steps of:

amplitude stabilizing the frequency modulated signal to obtain an amplitude stabilized signal;

filtering the amplitude stabilized signal for a first frequency that is offset by a shift frequency below an intermediate frequency, to obtain a first filtered signal;

filtering the amplitude stabilized signal for a second frequency that is offset by the shift frequency above the intermediate frequency, to obtain a second filtered signal;

detecting an envelope of the first filtered signal to obtain a first envelope signal;

detecting an envelope of the second filtered signal to obtain a second envelope signal;

differencing the first and second envelope signals to obtain a demodulated output signal;

selectivity filtering the frequency modulated signal for the intermediate frequency before amplitude stabilizing the signal;

generating mirror currents that are proportional to a current corresponding to the intermediate frequency; and controlling the first and second filtering frequencies and the selectivity filtering using the mirror currents.

* * * * *

UNITED STATES PATENT AND TRADEMARK OFFICE
CERTIFICATE OF CORRECTION

PATENT NO. : 7,405,613 B2 Page 1 of 1
APPLICATION NO. : 11/399058
DATED : July 29, 2008
INVENTOR(S) : De Ruijter It is certified that error appears in the above-identified patent and that said Letters Patent is hereby corrected as shown below:

In the Claims

Column 9, line 59, the text "circuit, is configured" should be changed to --circuit is configured--.

Column 11, line 2, the text "to obtain a first frequency" should be changed to --to obtain a second frequency--.

Column 11, line 5, the text "to obtain a first frequency" should be changed to --to obtain a second frequency--.

Signed and Sealed this

Twenty-fifth Day of November, 2008

JON W. DUDAS
*Director of the United States Patent and Trademark Office*